(12) United States Patent
Okamoto et al.

(10) Patent No.: US 6,438,000 B1
(45) Date of Patent: Aug. 20, 2002

(54) NOISE-CUT FILTER

(75) Inventors: Kenji Okamoto; Naoto Fukasawa, both of Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/559,947

(22) Filed: Apr. 27, 2000

(30) Foreign Application Priority Data

Apr. 27, 1999 (JP) .............................. 11-120594

(51) Int. Cl.[7] .............................. H02M 1/12; H03H 7/09
(52) U.S. Cl. .......................... 363/40; 336/232; 333/185
(58) Field of Search ..................... 363/40, 89; 336/200, 336/232; 333/184, 185

(56) References Cited

U.S. PATENT DOCUMENTS 5,892,668 A * 4/1999 Okamoto et al. ............. 363/40

FOREIGN PATENT DOCUMENTS

| JP | 59-52620 | 4/1984 |
|---|---|---|
| JP | 59-152606 | 8/1984 |
| JP | 3-211810 | 9/1991 |
| JP | 7-3125 | 1/1995 |

* cited by examiner

*Primary Examiner*—Rajnikant B. Patel
(74) *Attorney, Agent, or Firm*—Rossi & Associates

(57) ABSTRACT

A spiral LC composite member is formed by splicing together a desired number of rectangular dielectric chips between two spiral coils with rectangular cross sections. A noise-cut filter circuit is formed by laminating and connecting a desired number of spiral LC composite members. A desired number of noise-cut filter circuits are layered through insulation sheets, and are enclosed by a magnetic body so that a magnetic circuit can be formed at the core and the outer circumference of the multi-layered body. This constructs a filter circuit serving as a reactor and a capacitor.

16 Claims, 11 Drawing Sheets

NOISE-CUT FILTER

BACKGROUND OF THE INVENTION

1. Field of the Invention

The present invention relates to a noise-cut filter for an electric power converter such as an inverter, which filters switching noises generated with switching actions of semiconductor switching devices of the electric power converter.

2. Description of Related Art

The switching actions of the semiconductor switching devices of the electric power converter such as the inverter are taken according to pulse-width modulated (PWM) drive signals with a carrier frequency of several kHz or less than about twenty kHz. As a result of the switching actions, the electric power converter generates switching noises of frequency components of dozens of kHz or higher.

In recent years, the electric power converter is regulated by a variety of laws in order to reduce a harmful influence of components of 100 kHz or higher among frequency components of the switching noises upon external equipment. Accordingly, the electric power converter is provided with a noise-cut filter.

The conventional noise-cut filter for the electric power converter is constructed by connecting a single reactor, in which electric wire is wound on a core made of ferrite, amorphous alloy, crystal alloy or the like, with a single condenser made of film, chip, or the like in, for example, an inverted L-shape. This noise-cut filter filters the switching noises generated with the switching actions of the semiconductor switching devices.

The reactor used as the conventional noise-cut filter is ordinarily troidal, and the condenser is flat, cylindrical or the like in order to be inserted through a pin. When they are mounted on a printed circuit board inside the electric power converter, they require a larger mounting space than the volume thereof. Moreover, if the filter is mounted by separate wiring, there are too many parts to be connected and it is complicated to fix each part.

SUMMARY OF THE INVENTION

It is therefore an object of the present invention to provide a small and thin noise-cut filter for an electric power converter at low costs.

The first embodiment of the present invention is a noise-cut filter comprising: a spiral LC composite member in which a desired number of rectangular dielectric chips are bonded together in a state of being put between two spiral coils having rectangular sections; a noise-cut filter circuit, in which a desired number of layers of the spiral LC composite members are laminated through insulation sheets, and one spiral coils of the spiral LC composite member are connected at inside ends thereof to form main circuits for carrying a desired current, and the other spiral coils of the spiral LC composite members are connected at inside ends thereof to form earth circuits for carrying a current resulting from to a high frequency noise; a noise-cut filter circuit laminate in which a desired number of the noise-cut filter circuits are laminated through insulation sheets; and a filter circuit which is formed by enclosing the center and outer peripheral part of the noise-cut filter circuit laminate by a magnetic body in such a manner as to form magnetic circuits, the filter circuit functioning as a reactor and a condenser.

The second embodiment of the present invention is a noise-cut filter of the first embodiment, wherein the spiral coils are formed by pressing and stamping out a metal plate to a predetermined thickness.

The third embodiment of the present invention is a noise-cut filter of the first embodiment, wherein: the spiral coils of the main circuits are formed by pressing and stamping out a metal plate to a predetermined thickness, and the spiral coils of the earth circuits are of the same shape as the spiral coils of the main circuits except for thickness and are formed by pressing and stamping out a thin metal plate having a section for carrying a desired current.

The fourth embodiment of the present invention is a noise-cut filter of the first embodiment, wherein the spiral coils of the main circuits are formed by pressing and stamping out a metal plate to a predetermined thickness, and the spiral coils of the earth circuits are made of a printed circuit board formed by etching a copper foil in the same planar pattern as the spiral coils of the main circuits.

The fifth embodiment of the present invention is a noise-cut filter of the first embodiment, wherein the spiral coils of the main circuits are formed by pressing and stamping out a metal plate to a predetermined thickness, and the spiral coils of the main circuits are formed by coating conductive paste material of the same plane pattern as the spiral coils of the main circuits on insulation sheets, the earth circuit functioning as a resonance control resistance.

The sixth embodiment of the present invention is a noise-cut filter of one of the first through sixth embodiments, wherein conductive paste material is coated on surfaces of the rectangular dielectric chips, which are bonded with the spiral coils in advance, and the dielectric chips and the spiral coils are bonded together through conductive adhesive material.

The seventh embodiment of the present invention is a noise-cut filter of one of the first through fifth embodiments, wherein conductive paste material is coated on surfaces of the rectangular dielectric chips, which are bonded with the spiral coils in advance, and the dielectric chips and the spiral coils are bonded together through solder material.

The eighth embodiment of the present invention is a noise-cut filter of one of the first through fifth embodiments, wherein conductive paste material is coated on surfaces of the rectangular dielectric chips, which are bonded with the spiral coils in advance, and the dielectric chips and the spiral coils are bonded together through resin material.

The ninth embodiment of the present invention is a noise-cut filter of one of the first through eighth embodiments, wherein a filter unit is constructed by containing a noise-cut filter of any one of claims 1 through 8 in a plastic case, which is sealed with resin material.

The tenth embodiment of the present invention is a noise-cut filter unit of the ninth embodiment, wherein the resin material is made of high polymer resin material that is filled by an inorganic filler by a predetermined percentage.

The eleventh embodiment of the present invention is a noise-cut filter unit of one of the first through eighth, wherein a filter unit is constructed by containing a noise-cut filter of any one of the first through eighth embodiments 1 through 8 in a plastic case; sealing other area in the plastic case by the silicon gel; and sealing only an area at a side, where input/output terminals are arranged, by a high-polymer resin material that is filled by an inorganic filler by a predetermined percentage.

The twelfth embodiment of the present invention is a noise-cut filter unit as defined of the ninth embodiment, wherein the resin material is comprised of silicon gel, and a cover is provided in an area where input/output terminals are arranged in order to fix the terminals.

The thirteenth embodiment of the present invention is an electric power converter wherein a noise-cut filter of any one of the first through eighth embodiments or a noise-cut filter of one of the ninth through twelfth embodiments is connected to an input stage and/or an output stage of the electric power converter having switching devices to thereby form common mode choke coils, thus filtering switching noises generated with switching actions of the switching devices.

The fourteenth embodiment of the present invention is an electric power converter, wherein a noise-cut filter of one of the first through eighth embodiments or a noise-cut filter of one of the ninth through twelfth embodiments is connected to circuits in the electric power converter having switching devices to form common mode choke coils, thus filtering switching noises generated with switching actions of the switching devices.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

This invention will be described in further detail by way of example with reference to the accompanying drawings. FIGS. 1–5 show a method of manufacturing a noise-cut filter according to a first embodiment of the present invention. With reference to FIGS. 1–5, a single phase noise-cut filter using two noise-cut filter circuits is described as an example.

Figure 1:
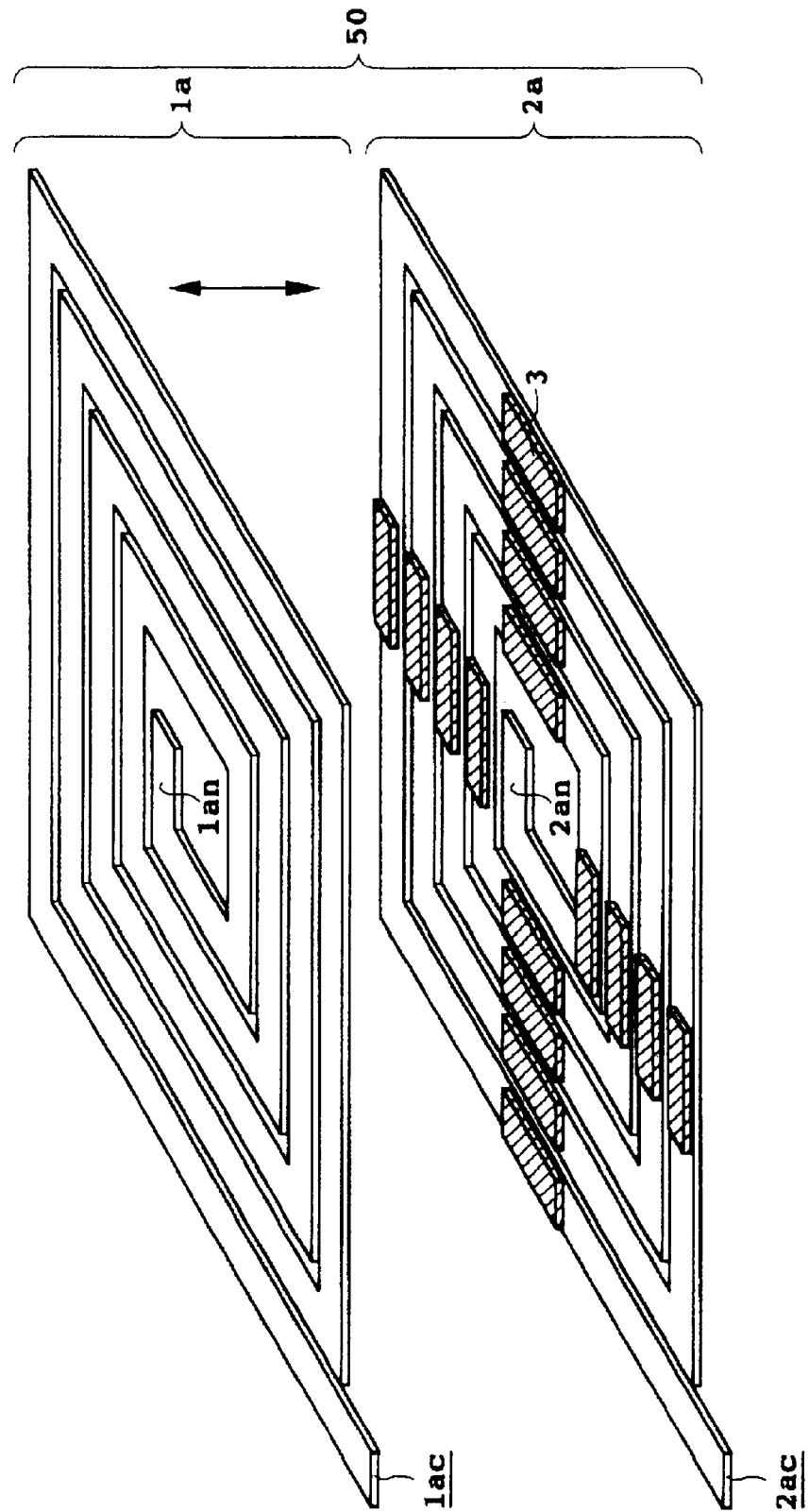
FIG. 1 is a view showing a method of manufacturing a first spiral LC composite member for use in a noise-cut filter according to a first embodiment of the present invention.

FIG. 1 is a view showing a step for forming a first spiral LC composite member. In FIG. 1, reference numerals 1a and 2a denote spiral coils serving as inductors.

The spiral coil 1a is a component of a main circuit (e.g., a circuit of an electric power converter), and thus, it needs to have a current capacity required for conducting a current in the main circuit. For example, the spiral coil 1a can be formed by pressing and stamping out a copper plate. In this case, a cross section required for achieving a current capacity of about 1 A–100 A is between 0.1 mm² and 10 mm², and more preferably between 0.2 mm² and 20 mm². The thickness of the spiral coil 1a may be about 0.2 mm–5.0 mm.

An area 1ac, which is projected by a predetermined length to the outside, is formed at an outermost end of the spiral coil 1a, so that the spiral coil 1a can be inserted and mounted into a print wiring board through a pin to thereby connect to an outside circuit. The innermost end of the spiral coil 1a is an area 1*an*, which is used for connecting to a spiral coil of another main circuit.

The spiral coil 2*a* is a component of an earth circuit. The spiral coil 2*a* may be of the same shape and made of the same material as the spiral coil 1*a*. Preferably, the spiral coil 2*a* has the same plane pattern as that of the spiral coil 1*a*. The cross section of the spiral coil 2*a* may be the same as that of the spiral coil 1*a*, or may be different from that of the spiral coil 1*a*.

An innermost end of the spiral coil 2*a* is an area 2*an*, which is used for connecting to a spiral coil of another earth circuit.

Reference numeral 3 denotes a dielectric chip. The dielectric chip 3 connects to the spiral coils 1*a* and 2*a* to compose a capacitor. The dielectric chip 3 is preferably made of material having a large capacitance, e.g., ferroelectric ceramics such as $BaTiO_3$, $SrTiO_3$ and lead zirconate titanate (PZT). The thickness of the dielectric chip 3 is between 50 Fm and 2 mm, and more preferably between 100 Fm and 1 mm. More preferably, the thickness of the dielectric chip 3 is between 0.4 mm and 1 mm. The width of the dielectric chip 3 is the same as or less than that of the spiral coil 1*a*. The length of the dielectric chip 3 is the same as or less than one side of the spiral coil 1*a*.

The required number of dielectric chips 3 are put tightly at regular intervals between the spiral coils 1*a* and 2*a*, and they are bonded together. This constructs the first spiral LC composite member 50 serving as the one-layer inductor and capacitor.

Figure 2:
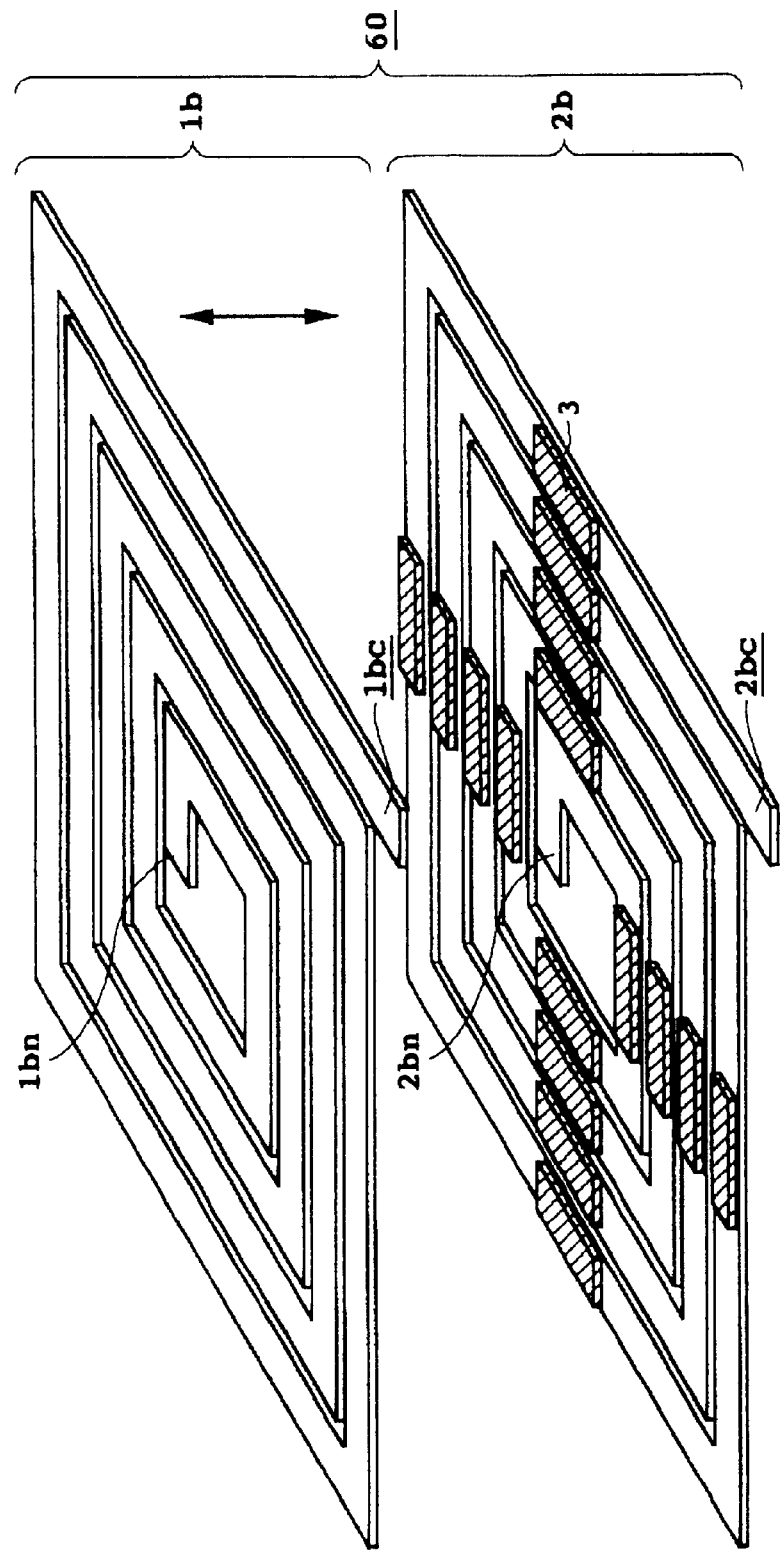
FIG. 2 is a view showing a method of manufacturing a second spiral LC member for use in the noise-cut filter according to the first embodiment of the present invention.

FIG. 2 is a view showing a step for manufacturing a second spiral composite member 60 having the same functions as the spiral LC composite member 50. The second spiral LC composite member 60 is used to increase inductance L and capacitance C by laminating multiple layers of spiral LC composite member.

Components 1*b*, 2*b* and 3 of the second spiral composite member 60 may be made of the same material and of the same shape as the corresponding components 1*a*, 2*a* and 3 of the spiral LC composite member 50. As is the case with the first spiral LC composite member, the spiral coil 1*b* is a component of a main circuit, and the spiral coil 2*b* is a component of an earth circuit.

The spiral coil 1*b* has an area 1*bc* for connecting to an outside circuit. The area 1*bc* is formed at the outermost end of the spiral coil 1*b*. An area 1*bn* for connecting to a spiral coil of another main circuit is formed at the innermost end of the spiral coil 1*b*.

An area 2*bc*, which is projected by a predetermined length to the outside, is formed at an end of the spiral coil 2*b*, so that the spiral coil 2*b* can be inserted and mounted into a print wiring board through a pin to thereby connect to an outside circuit. The innermost end of the spiral coil 2*b* is an area 2*bn*, which is used for connecting to a spiral coil of another earth circuit.

As is the case with the spiral LC composite member 50, a predetermined number of dielectric chips 3 are put between the spiral coil 1*b* for the main circuit and the spiral coil 2*b* for the earth circuit to thereby form the spiral LC composite member 60 serving as the inductor and the capacitor.

Figure 3:
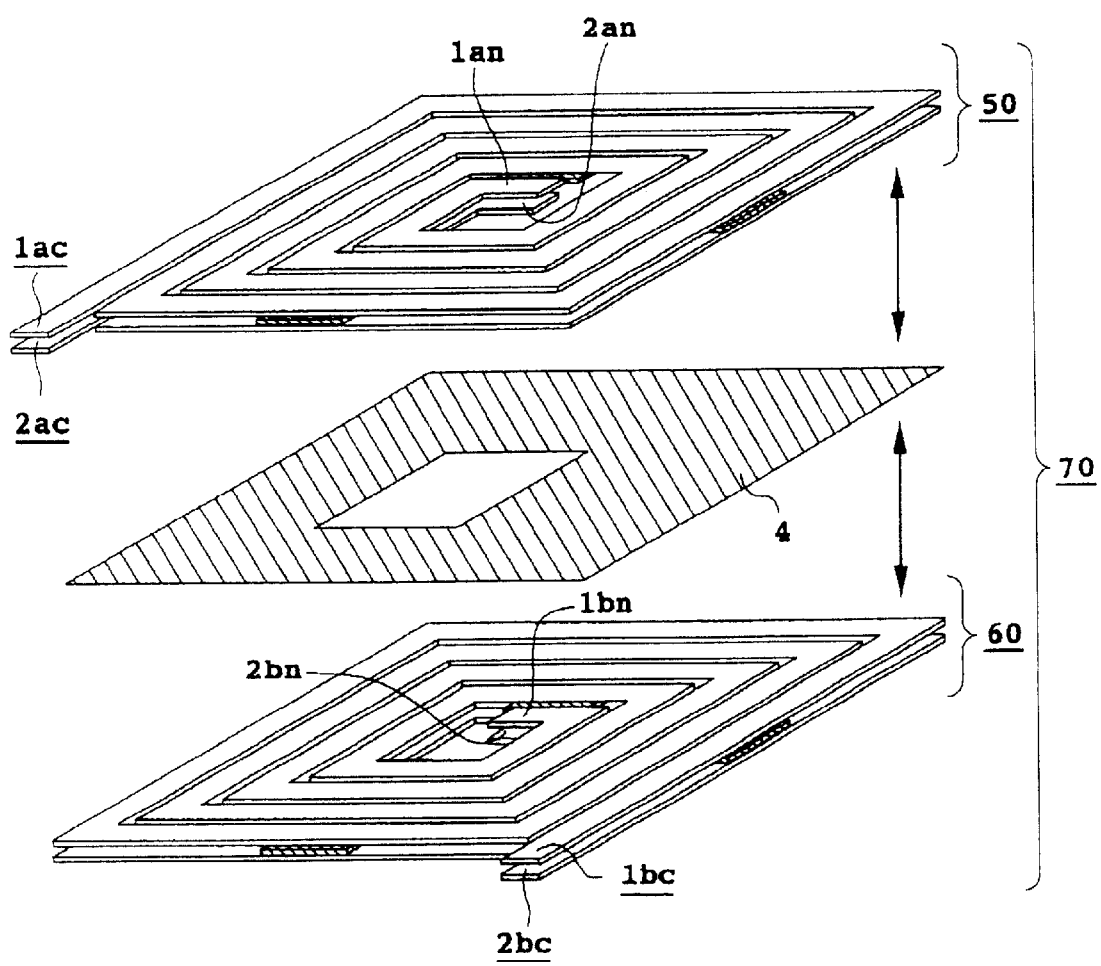
FIG. 3 is a view showing a method of manufacturing a noise-cut filter circuit for use in the noise-cut filter according to the first embodiment of the present invention.

FIG. 3 is a view showing a step 3 for splicing together the spiral LC composite member 50 and the spiral composite member 60 to form a noise-cut filter circuit 70.

The spiral LC composite member 50 and the spiral LC composite member 60 are laminated through an insulation sheet 4, and they are bonded together at the terminals inside both composite members. The main control circuit inside terminal 1*an* of the spiral LC composite member 50 and the main circuit inside terminal 1*bn* of the spiral LC composite member 60 are bonded together by soldering with the use of a metal piece or the like for covering a step. They may also be bonded together by electric spot welding or pressure welding.

The earth circuits are connected by connecting the earth circuit inside terminal 2*an* of the spiral LC composite member 50 and the earth circuit inside terminal 2*bn* of the spiral LC composite member through an electric wire so as not to contact with the main circuit.

Figure 4:
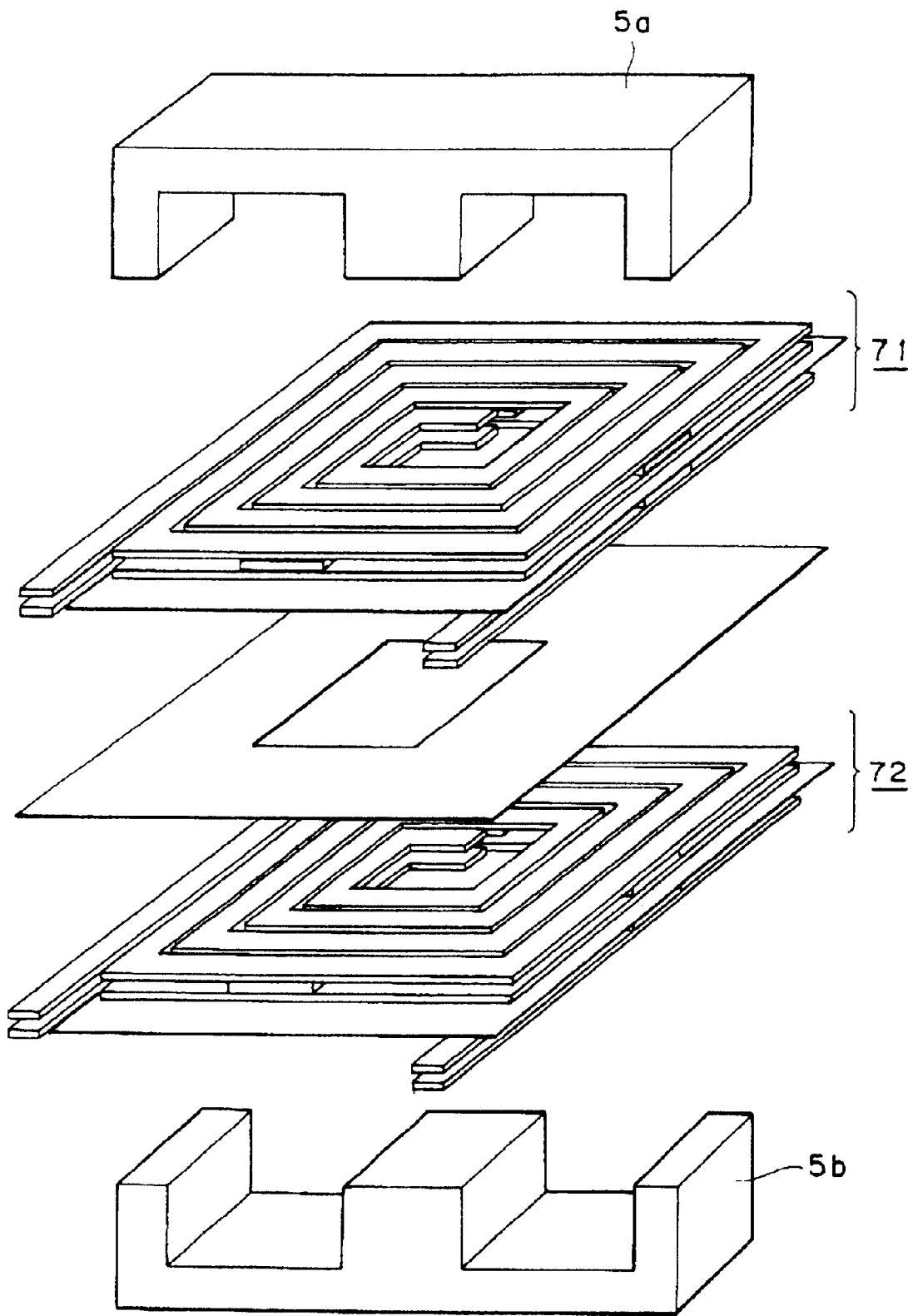
FIG. 4 is a view showing a method of manufacturing a noise-cut filter circuit multi-layered body for use in the noise-cut filter according to the first embodiment of the present invention.

FIG. 4 is a view showing a step 4 for laminating noise-cut filter circuits 71 and 72 through the insulation sheet 4 to form a noise-cut filter circuit laminate and putting the noise-cut filter circuit laminate between magnetic body dividing cores. The noise-cut filter circuit 71 and 72 are equivalent to the two noise-cut filter circuit 70 produced in the steps 1–3. The noise-cut filter circuit laminates (71, 4 and 72) are put between the magnetic body dividing cores 5*a* and 5*b* to thereby increase the inductance of the spiral coils inside the noise-cut filter circuits 71 and 72.

The magnetic body dividing cores 5*a* and 5*b* are shaped like a letter E, and they are bonded together at the central section of the noise-cut filter circuit laminate and at the outer circumference of the inductor-capacitor. Thus, the magnetic body dividing cores 5*a* and 5*b* form a magnetic circuit at the circumference of the noise-cut filter circuit laminate. The magnetic body dividing cores 5*a* and 5*b* are made of normal magnetic material, and more preferably, they are made of iron. The two noise-cut filter circuits 70 (i.e., 71 and 72) are laminated through the insulation sheet 4, and are put between the magnetic body dividing cores 5*a*, 5*b* to thereby form a filter that is composed of a common mode choke coil and a ground capacitor for use in a single phase line filter. The upper noise-cut filter circuit is a U-phase, and the lower noise-cut filter circuit is a V-phase. Therefore, the main circuit connecting parts (equivalent to 1*ac* and 1*bc* in the noise-cut filter circuit 70 in FIG. 3) are used as input/output terminals U1 and U2 of the U-phase, and the earth circuit connecting part (equivalent to 2*bc* in the noise-cut filter circuit 70 in FIG. 3) is used as an earth terminal P. Likewise, input/output terminals V1, V2 and an earth terminal P of the lower noise-cut filter circuit are illustrated in FIG. 5

Although not illustrated in the drawings, when three noise-cut filter circuits 70 are laminated through insulation sheets and are put between the magnetic body dividing cores, it is possible to form a three-phase line filter that is composed of a common mode reactor and a ground capacitor. In this case, the three noise-cut filter circuits are a U-phase, a V-phase and a W-phase, respectively.

Figure 5:
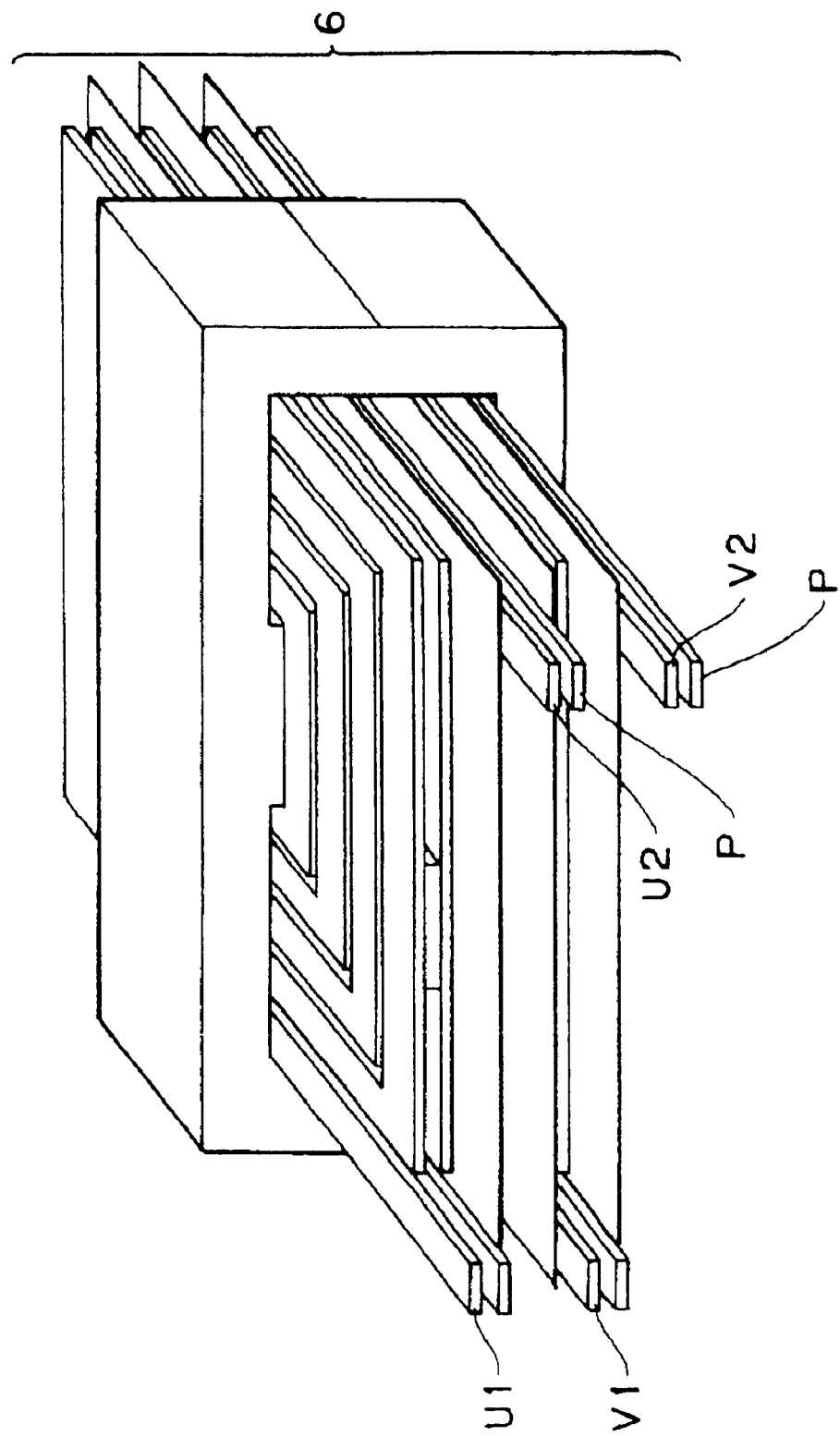
FIG. 5 is a view showing a method of manufacturing a finished product of the noise-cut filter according to the first embodiment of the present invention.

FIG. 5 is a view showing a step 5 for fixing the magnetic body dividing cores 5*a*, 5*b* to thereby complete the single-phase noise-cut filter 6. A noise-cut filter 6 serves as a reactor and a capacitor. The magnetic body dividing cores 5*a*, 5*b* are fixed by using a technique that is well known in the field of the present invention, for example, by welding.

Figure 6:
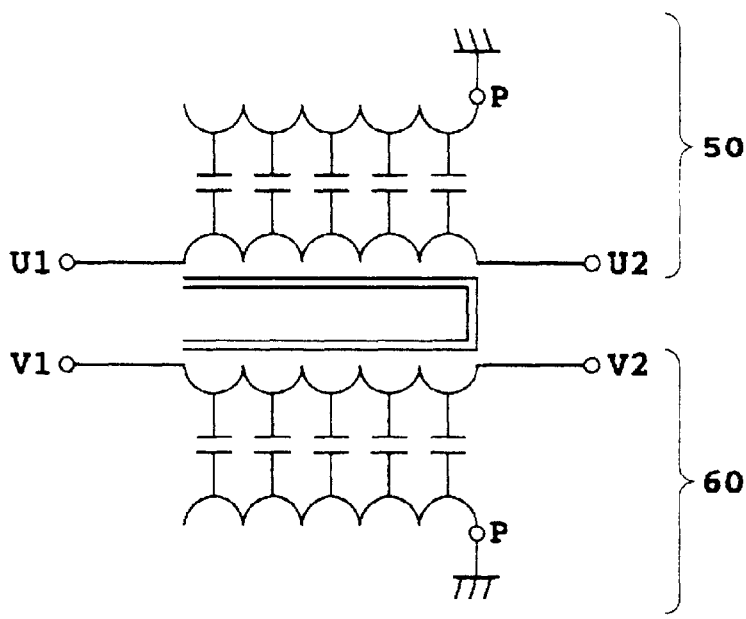
FIG. 6 is a circuit diagram showing an LC distributed constant circuit as an equivalent circuit of the noise-cut filter according to the present invention and a common mode reactor for the LC distributed constant circuit.

Referring next to FIG. 6, a description will be given of the electrical property of the noise-cut filter according to the present invention. FIG. 6 is an equivalent circuit diagram of the single-phase noise-cut filter 6 according to the present invention in FIG. 5. In FIG. 6, the main circuit spiral coils of each noise-cut filter circuit have a predetermined length, and thus, micro-inductances are continuously distributed between the input/output terminals of the U-phase and the V-phase, in other words, between U1 and U2 and between V1 and V2. Similarly, micro-inductances are continuously distributed in the case of the earth spiral coil connected to the terminal P. The dielectric chips 3 are spatially distributed between the main circuit spiral coil and the earth spiral coil of the spiral LC composite members 50 and 60 (see FIGS. 1 and 2). Therefore, the main circuits U1–U2 and V1–V2 connect to the earth circuit thereof through a predetermined capacitance at regular intervals. This constructs a distributed constant circuit having the functions of a low-pass filter. In this case, the low-pass filter has a cut-off frequency (e.g., 10 kHz or more) required for filtering the switching noises generated with the switching actions of a semiconductor switching device of electric power conversion equipment such as an inverter. The noise-cut filter circuit of the present invention changes the capacitance or the inductance by changing the material and/or shape of the dielectric chips to thereby achieve a variety of cut-off frequencies. Preferably, the noise-cut filter circuit of the present invention has the cut-off frequency of 10–150 kHz. More preferably, the noise-cut filter circuit of the present invention has the cut-off frequency of 10–50 kHz.

Figure 7:
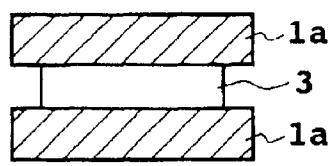
FIG. 7 is a cross-sectional view showing a spiral LC composite member, in which an dielectric chips is put between two main circuit spiral coils, according to a second embodiment of the present invention.

Referring next to FIG. 7, there will be explained the second embodiment of the present invention.

FIG. 7 is a cross-sectional view showing the state wherein an inductor chip 3 is put between two main circuit spiral coils 1a. In FIG. 7, an earth circuit spiral coil 2a is equivalent to the main circuit spiral coil 1a. The main circuit spiral coil has a predetermined current capacity that can be varied by changing the thickness of a metal plate such as copper, which constructs the coil, to change the cross section of the coil. The spiral coil may be formed by stamping out a metal plate, which is composed of a material such as copper. In this case, a copper plate with a thickness of 0.2 mm–1.0 mm is used as the metal plate. If a large capacity of current is required and the current density is too high when a single spiral coil is used, or if a large inductance and/or capacitance is required, it is possible to use a plurality of spiral coils. In this case, a desired number of spiral coils of the same shape are laminated and connected in parallel to lower the current density or achieve the desired inductance and/or capacitance. If the same spiral coil as the main circuit spiral coil 1a is used as the earth circuit, there is no necessity of manufacturing an earth circuit spiral coil separately.

Figure 8:
FIG. 8 is a cross-sectional view showing a spiral LC composite member, in which an inductor chip is put between a main circuit spiral coil and a thin earth circuit spiral coil, according to a third embodiment of the present invention.

Referring now to FIG. 8, there will be explained the third embodiment of the present invention.

FIG. 8 is a cross-sectional view of a noise-cut filter circuit in which an inductor chip 3 is put between a main circuit spiral coil 1a and an earth circuit spiral coil 2a having a different cross section from the main circuit spiral coil 1a. The earth circuit spiral coil 2a only has to conduct the current of noise-cut components flowing through the inductor chip 3. Thus, the cross section thereof can be smaller than that of a main circuit coil pattern. Moreover, if the main circuit spiral coil 1a and the earth circuit spiral coil 2a are thick, a tension resulting a thermal stress is applied to the central part of the inductor chip 3 along the thickness. This tension may tear up the inductor chip 3. If a capacitance of the condenser composed of the inductor chip 3 is taken into consideration, the earth circuit spiral coil 2a is preferably of the same shape as the main circuit spiral coil 1a except for the thickness.

Figure 9:
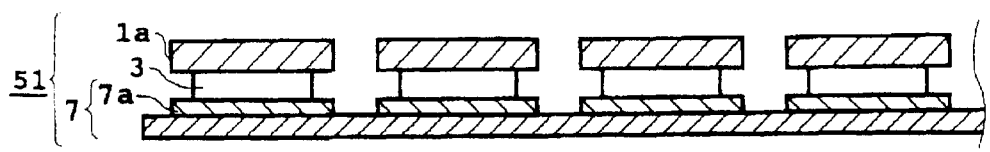
FIG. 9 is a cross-sectional view showing a spiral LC composite member, in which an inductor chip is put between a main circuit spiral coil and a print circuit board coil, according to a fourth embodiment of the present invention.

Referring next to FIG. 9, there will be explained the fourth embodiment of the present invention.

FIG. 9 is a conceptual sectional view showing a spiral LC composite member 51 having a print circuit board as an earth circuit spiral coil. An earth circuit coil 7a of an earth circuit print circuit board 7 is constructed by etching a copper foil of a copper-clad laminate board spirally in the same manner as the main circuit coil. The ordinary copper foil with the thickness of 18 μm, 35 μm, 70 μm and the like may be used for the earth circuit coil 7a. The inductor chip 3 is arranged at the top of the earth circuit coil 7a, and the main circuit spiral coil 1a is laminated on the inductor chip 3 to thereby form the spiral coil LC composite member 51.

The use of the print circuit board as the earth circuit spiral coil makes it easier to maintain the shape of the entire coil. Since the print circuit board has a smaller rigidity than the copper plate, the tension resulting from the thermal stress is never applied to the central part of the inductor chip 3. Moreover, the print circuit board is made of an insulating body such as glass epoxy, and it is therefore possible to maintain the insulation between spiral LC composite members 51 without using any insulation sheet in the case where a plurality of spiral LC composite members 51 are laminated.

Figure 10:
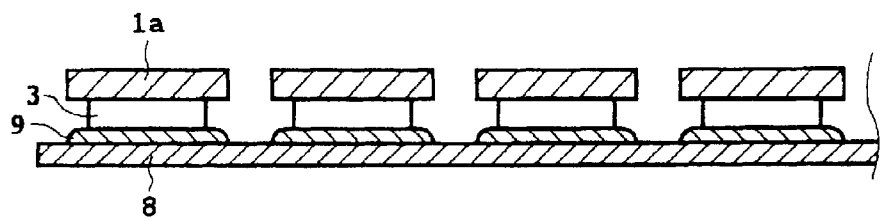
FIG. 10 is a cross-sectional view showing a spiral LC composite member, in which a coil formed of conductive paste on an insulation sheet is used as an earth circuit coil, according to a fifth embodiment of the present invention.

Referring next to FIG. 10, there will be explained the fifth embodiment of the present invention.

FIG. 10 is a cross-sectional view showing a spiral LC composite member having an earth circuit coil made of conductive paste on an inductor board. The conductive paste is coated spirally on an insulation sheet 8 such as a glass epoxy board to thereby form an earth circuit conductive paste coil 9. An inductor chip 3 is arranged at the top of the earth circuit conductive paste coil 9, and a main circuit spiral coil 1a is laminated on the inductor chip 3 to thereby form the spiral LC composite member.

The conductive paste is formed by kneading silver powder, copper powder and a binder. The conductive paste has a higher resistance than the copper foil and the like, and thus, the formation of a pattern generates a resistance of about 1S–100S. When a noise-cut current is carried from the main circuit spiral coil 1a to the earth circuit coil through the inductor chip 3, a resonance phenomenon occurs due to the inductance and the capacitance under some conditions to raise a noise voltage. To address this problem, a resister is provided between the earth circuit coil and an earth wire in order to prevent the resonance phenomenon. According to the present embodiment, however, the earth coil is made of the conductive paste, and the paste has a resistance to some extent, and this eliminates the necessity of providing the resistor for preventing the resonance phenomenon.

Figure 11:
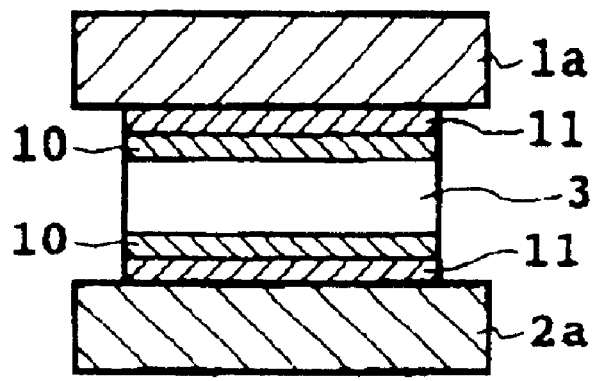
FIG. 11 is a cross-sectional view showing a spiral LC composite member, in which an inductor ship coated with electrodes is bonded to a main circuit coil and an earth circuit coil through conductive adhesive material, according to a sixth embodiment of the present invention.

Referring next to FIG. 11, there will be explained the sixth embodiment of the present invention.

FIG. 11 is a cross-sectional view showing the state wherein an inductor chip 3, in which conductive paste is coated and electrodes are formed on the upper and lower sides in advance, a main circuit spiral coil 1a and an earth circuit spiral coil 2a are bonded together by a conductive adhesive material 11. Electrodes 10 are formed on the bonded surface between the spiral coils 1a and 2a of the inductor chip 3. The electrodes 10 are thin layers composed of metal or conductive paste. If the conductive paste is used, it may be comprised mainly of Ag and may be formed by coating and hardening the conductive paste by screen printing. If the metal is used, the electrodes 10 can be formed in a sputtering method using copper and the like, a vacuum evaporation method or a plating method. After the conductive adhesive material 11 is coated on the electrodes 10, the electrodes 10 are pressed tightly between the main circuit spiral coil 1a and the earth circuit spiral coil 2a. Then, the electrodes 10 are heated, hardened and adhered. Therefore, a capacitor is formed between the main circuit spiral coil 1*a* and the earth circuit spiral coil 2*a*.

Figure 12:
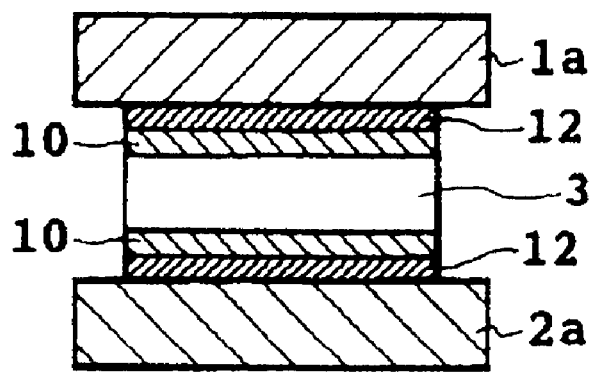
FIG. 12 is a cross-sectional view showing a spiral LC composite member, in which an inductor chip coated with electrodes is bonded to a main circuit coil and an earth circuit coil through soldering material, according to a seventh embodiment of the present invention.

FIG. 12 is a cross-sectional view showing the state wherein an inductor chip 3, on which electrodes 10 are formed on the upper and lower sides in advance, a main circuit spiral coil 1*a* and an earth circuit spiral coil 2*a* are bonded together by solder 12. The electrodes 10 can be made of the above-mentioned material. Consequently, a capacitor is formed between the main circuit spiral coil 1*a* and the earth circuit spiral coil 2*a*. The use of the solder 12 reduces the time required for splicing.

Figure 13:
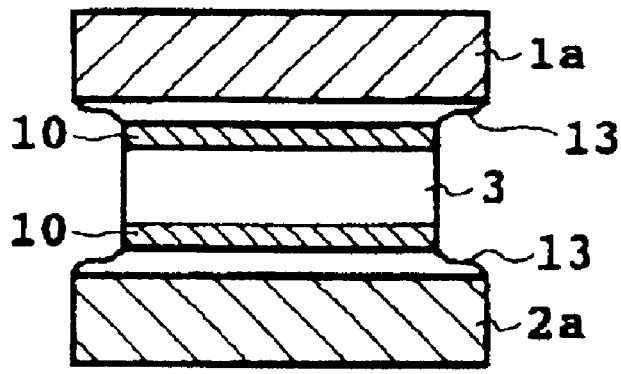
FIG. 13 is a cross-sectional view showing a spiral LC composite member, in which an inductor chip coated with electrodes is bonded to a main circuit coil and an earth circuit coil through high molecular resin material, according to an eighth embodiment of the present invention.

Referring next to FIG. 13, there will be explained the eighth embodiment of the present invention.

FIG. 13 is a cross-sectional view showing the state wherein an inductor chip 3, on which electrodes 10 are formed on the upper and lower sides in advance, a main circuit spiral coil 1*a* and an earth circuit spiral coil 2*a* are bonded together by resin material 13. The electrodes 10 may be made of the above-mentioned material. Liquid epoxy resin and the like is used as the resin material 13. After the resin material 13 is coated on the electrodes 10, the electrodes 10 are pressed tightly between the main circuit spiral coil 1*a* and the earth circuit spiral coil 2*a*. Although the resin material 13 such as the epoxy resin is insulative, the resin material 13, the electrodes 10 and the spiral coils are in contact with one another due to the fine unevenness of the surfaces of the electrodes 10 and the spiral coils 1*a* and 2*a*. Even if they are not in contact, the resin material 13 functions as an inductor of a capacitor to form a capacitor between the electrodes 10, the main circuit spiral coil 1*a* and the earth circuit spiral coil 2*a* on condition that the resin material 13 has the thickness of 1 Fm–2 Fm. A desired capacitance can be formed between the inductor chip 3 and the spiral coils in one of the above-mentioned methods. The conductive adhesive material made of silver or the like is expensive, but the epoxy resin is cheap. Thus, the present embodiment reduces the cost.

Figure 14:
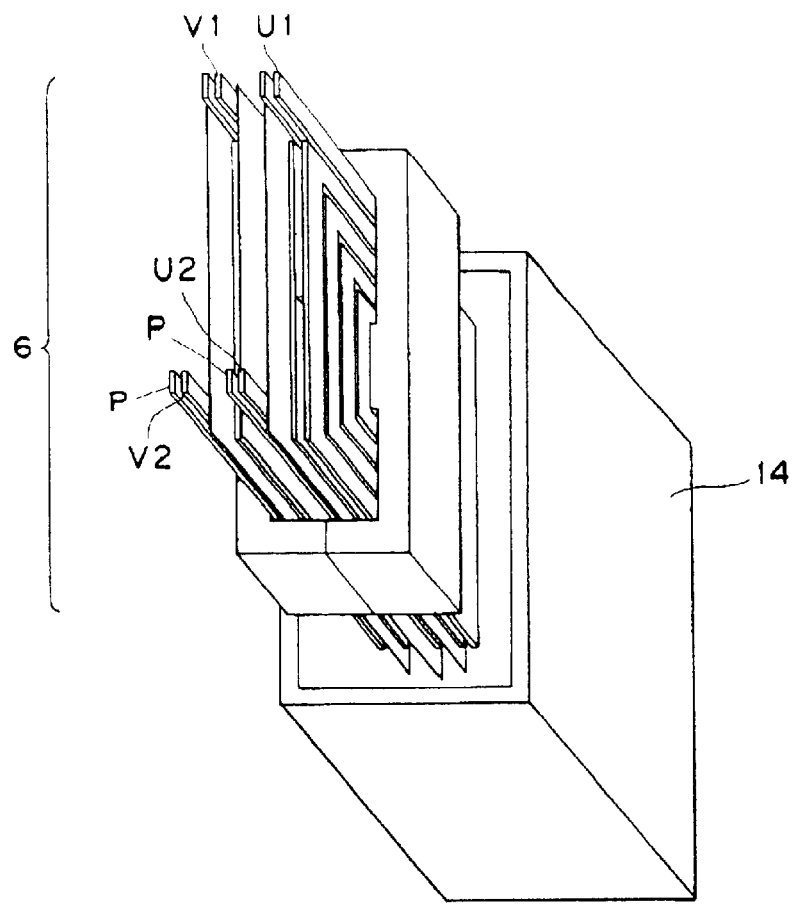
FIG. 14 is a perspective view showing a noise-cut filter unit, which is contained in a plastic case sealed by resin material, according to a ninth embodiment of the present invention.
Figure 14:
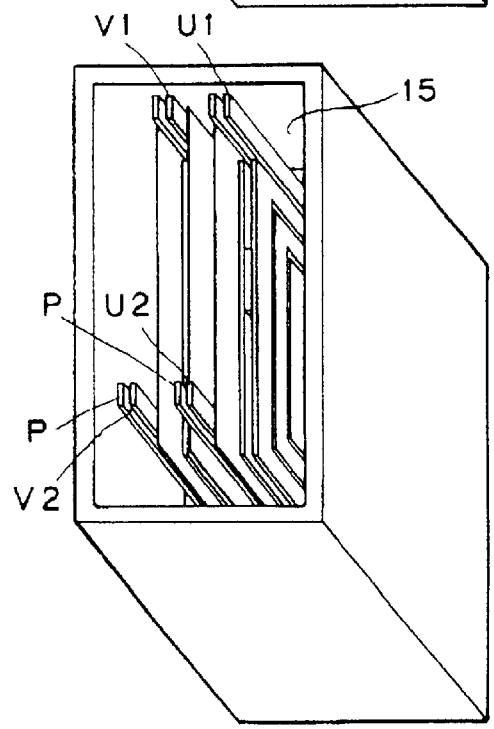

Referring next to FIG. 14, there will be explained the ninth embodiment of the present invention.

FIG. 14 is a view showing a noise-cut filter unit in the case where the single-phase noise-cut filter 6 of the present invention is contained in a plastic case 14. The plastic case 14 is required to be insulative, fast, resistive to contamination. The plastic case 14 may be made of PBT (polybutylene terephthalate), PPS (polyphenylene sulfide) or the like. If the single-phase noise-cut filter 6 is contained in the plastic case, it can be protected from the contamination by dust and insulated from external circuits.

Figure 15:
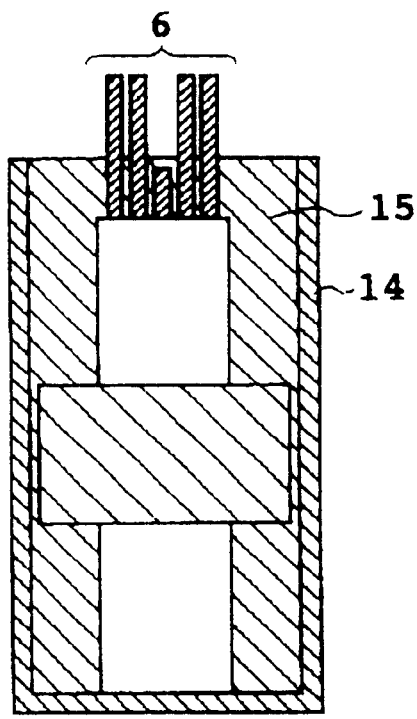
FIG. 15 is a cross-sectional view showing the structure of a noise-cut filter unit, which is contained in a plastic case sealed by resin material including an inorganic filter, according to a tenth embodiment of the present invention.

Referring next to FIG. 15, there will be explained the tenth embodiment of the present invention.

FIG. 15 is a sectional view showing a noise-cut filter unit in the case wherein the single-noise-cut filter 6 of the present invention is contained in a plastic case 14, and is sealed by high polymer resin material 15.

The plastic case 14 may be made of the above-mentioned material. The high polymer resin material 15 is made of epoxy resin, urethane resin, silicon resin to which an inorganic filler such as quartz powder and alumina powder is added. Sealing the plastic case 14 by the high polymer resin material 15 improves the insulation characteristics and protects the single-noise-cut filter 6 from the contamination by dust and the like, thereby preventing the deterioration of the insulation characteristics.

The high polymer insulating material is required to have a proper thermal expansion coefficient, a high electric insulation performance, a high thermal conductivity, a high mechanical strength and the like. The thermal expansion coefficient of the high polymer resin material 15 must be nearly equal to that of the magnetic body dividing cores 5*a*, 5*b* in order to prevent distortion resulting from the thermal stress. In order to effectively dissipate heat generated from the conduction, the thermal transfer coefficient must be large. A large thermal transfer coefficient can be achieved by including the filler in the high polymer resin material 15.

In this embodiment, the high polymer resin material 15 having a high mechanical strength fixes lead terminals U1, U2, V1, V2, and P. Therefore, it is possible to prevent an external force from being applied to components (e.g., spiral coils) of the inside noise-cut filter 6 even if the external force is applied to the lead terminals U1, U2, V1, V2, and P.

Figure 16:
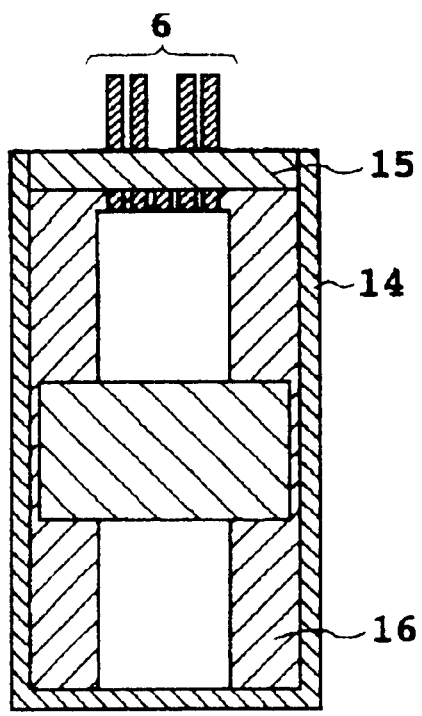
FIG. 16 is a cross-sectional view showing a noise-cut filter unit, which is contained in a plastic case sealed by silicon gel, according to an eleventh embodiment of the present invention.

Referring next to FIG. 16, there will be explained the eleventh embodiment of the present invention.

FIG. 16 is a cross-sectional view showing a noise-cut filter unit in which the noise-cut filter 6 is contained in a plastic case 14, which is sealed by silicon gel 16 up to an area close to an opening, and the top of the silicon gel 16 is sealed by high polymer resin material 15. The plastic case 14 and the high polymer resin material 15 are made of the above-mentioned material.

The materials for sealing the inside and the surface of the plastic case 14 are selected independently of one another, and this improves the insulation characteristics and prevents the dust from contaminating the inside from the opening, thus preventing the deterioration of the insulation.

The use of the silicon gel 16 with a small elasticity achieves a mechanical reliability without causing the distortion resulting from the thermal stress. The high polymer resin material 15 fixes lead terminals U1, U2, V1, V2, P of the noise-cut filter 6. Therefore, it is possible to prevent an external force from being applied to components (e.g., spiral coils) of the inside noise-cut filter 6 even if the external force is applied to the lead terminals U1, U2, V1, V2, P.

Figure 17:
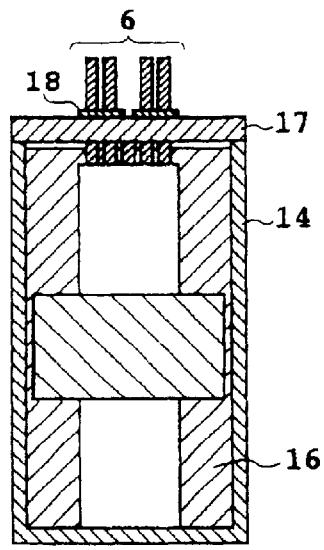
FIG. 17 is a cross-sectional view showing a noise-cut filter unit, which is contained in a plastic case provided with a cover for fixing the noise-cut filter, according to a twelfth embodiment of the present invention.

Referring next to FIG. 17, there will be explained the twelfth embodiment of the present invention.

FIG. 17 is a cross-sectional view showing a noise-cut filter unit wherein the noise-cut filter is contained in a plastic case 14, which is sealed by silicon gel up to an area close to an opening covered with a terminal fixing cover 17. Lead terminals U1, U2, V1, V2, P of the noise-cut filter 6 are fixed by adhesive material 18. The plastic case 14 and the silicon gel 16 are made of the above-mentioned material.

Fixing the lead terminals U1, U2, V1, V2, P of the noise-cut filter 6 by the terminal fixing cover 17 and the adhesive material 18 prevents an external force from being applied to the noise-cut filter 6 even if the external force is applied to the lead terminals U1, U2, V1, V2, P. Moreover, it is possible to prevent the dust from contaminating the inside from the opening.

The terminal fixing cover 17 may be made of high polymer resin material such as PBT and PPS, which are easy to mold.

The adhesive material 18 may be an insulative adhesive material, which is ordinarily used in the field of this invention. For example, the adhesive material 18 may be selected from epoxy resin, polyester resin, acrylic resin or silicon rubber Referring next to FIGS. 18–20, there will be explained the thirteenth embodiment of the present invention.

Figure 18:
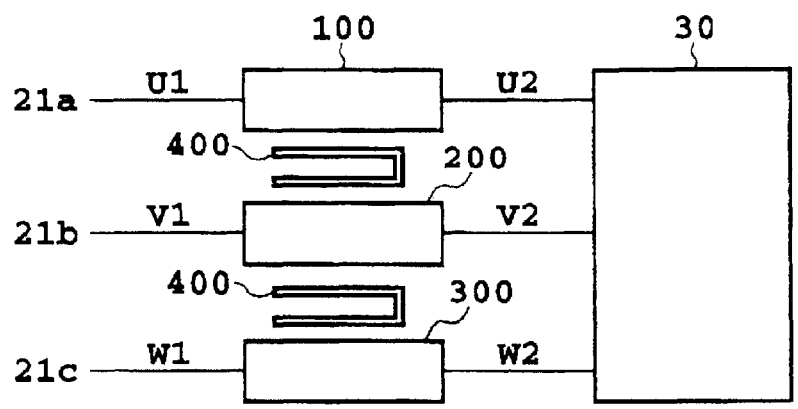
FIG. 18 is a circuit diagram in the case where a noise-cut filter is provided at an input stage of an electric converter according to a thirteenth embodiment of the present invention.

FIG. 18 is a circuit diagram showing the case wherein the noise-cut filter of the present invention is provided at an input stage of an electric power converter 30 such as an inverter. In this embodiment, three pairs (three phases) of noise-cut filter circuits 100, 200, 300 are used. Magnetic body dividing cores 400 and 400 are inserted in-between the noise-cut filter circuits.

In the embodiments described with reference to FIGS. 1–17, the noise-cut filter 6 uses two noise-cut filter circuits for the single phase. If, however, the noise-cut filter is constructed for three phases, a noise-cut filter circuit 300 is mounted below the noise-cut filter circuit 72 through an insulation sheet in the step 4 in FIG. 4.

Lead terminals of the noise-cut filter circuit 100 that is constructed in the above-mentioned manner are regarded as U1, U2; lead terminals of the noise-cut filter circuit 200 are regarded as V1, V2; and lead terminals of the noise-cut filter circuit 300 are regarded as W1, W2. The lead terminals U1, V1, W1 are connected to input conductors 21a, 21b, 21c, and the lead terminals U2, V2, W2 are connected to the electric power converter 30.

It is therefore possible to filter the noises which enter the electric power converter 30 from the input conductors 21a, 21b, 21c, and prevent the switching noises generated by devices inside the electric power converter from being conducted to the input conductors 21a, 21b, 21c.

Figure 19:
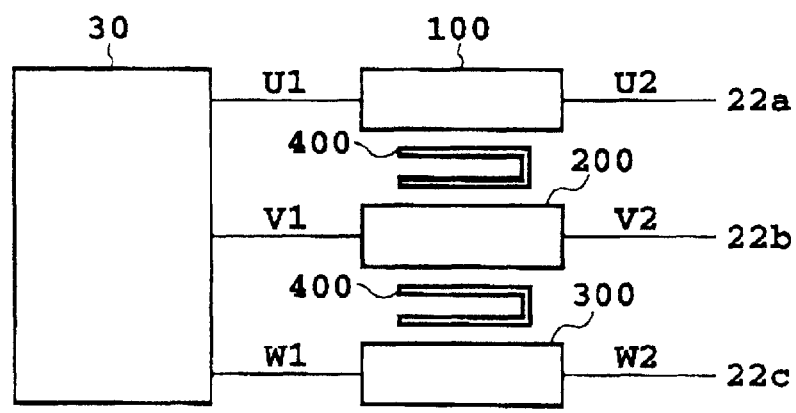
FIG. 19 is a circuit diagram in the case where a noise-cut filter is provided at an output stage of an electric converter according to a fourteenth embodiment of the present invention.

FIG. 19 shows an example wherein the noise-cut filters 100, 200, 300 serving as reactors according to the present invention are provided at an output stage of the electric power converter 30 such as the inverter. Magnetic body dividing cores 400 and 400 are inserted in-between the noise-cut filter circuits.

It is therefore possible to filter the switching noises generated by devices inside the electric power converter 30 and prevent the switching noises from being conducted from the electric power converter 30 to the output conductors 22a, 22b, 22c. It is also possible to filter the noises which enter the electric power converter 30 from the output conductors 22a, 22b, 22c.

Figure 20:
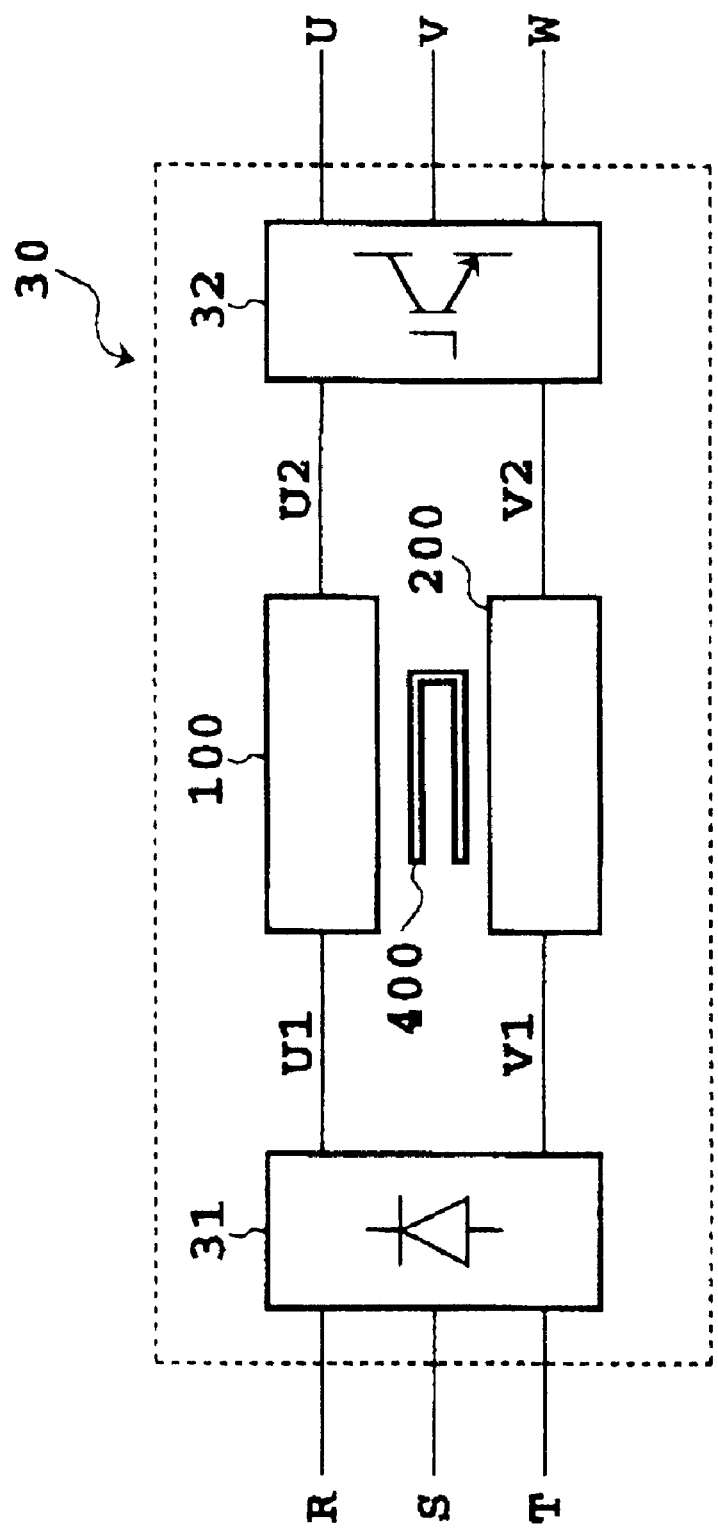
FIG. 20 is a circuit diagram in the case where a noise-cut filter is provided inside an electric converter according to a fifteenth embodiment of the present invention.

FIG. 20 shows an example wherein the noise-cut filter circuits 100, 200 of the present invention are provided inside the electric power converter 30 such as the inverter.

In the electric power converter 30, a rectifier 31 for converting an alternating current, which is inputted from the outside, into a direct current is provided at an input side, and a semiconductor switching device 32 is provided at an output side.

The lead terminals U1, V1 are connected to the rectifier 31 at the input side, and the lead terminals U2, V2 are connected to the semiconductor switching device 32 at the output side.

Therefore, it is possible to filter the noise which enters the semiconductor switching device 32 from input terminals R, S, T through the rectifier 31, and prevent the switching noises generated by the semiconductor switching device 32 from being conducted to the input terminals R, S, T.

As set forth hereinabove, the present invention provides the noise-cut filter, which is able to surely cut the noises such as the switching noises in the electric power converter and secures the current capacity of several amperes or more required for the electric power converter.

Moreover, a plurality of noise-cut filter circuits is contained in the plastic case, in which gaps are filled by the high polymer resin material or the like. This makes it easier to manufacture the noise-cut filter. Therefore, the present invention provides the small and inexpensive noise-cut filter, which can easily be mounted on a printed wiring board and has excellent insulation characteristics and mechanical reliability.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A noise-cut filter comprising:
    a spiral LC composite member in which a plurality of rectangular dielectric chips are bonded together in a state of being put between two spiral coils;
    a noise-cut filter circuit, in which a desired number of layers of said spiral LC composite members are laminated through insulation sheets, and one spiral coils of said spiral LC composite member are connected at inside ends thereof to form main circuits for carrying a desired current, and the other spiral coils of said spiral LC composite members are connected at inside ends thereof to form earth circuits for carrying a current resulting from a high frequency noise;
    a noise-cut filter circuit laminate in which a desired number of noise-cut filter circuits are laminated through insulation sheets; and
    a filter circuit which is formed by enclosing the center and outer peripheral part of said noise-cut filter circuit laminate by a magnetic body in such a manner as to form magnetic circuits, said filter circuit functioning as a reactor and a condenser.

2. A noise-cut filter as defined in claim 1, wherein said spiral coils are formed by pressing and stamping out a metal plate to a predetermined thickness.

3. A noise-cut filter as defined in claim 1, wherein:
    said spiral coils of said main circuits are formed by pressing and stamping out a metal plate to a predetermined thickness, and said spiral coils of said earth circuits are of the same shape as said spiral coils of said main circuits except for thickness and are formed by pressing and stamping out a thin metal plate having a section for carrying a desired current.

4. A noise-cut filter as defined in claim 1, wherein said spiral coils of said main circuits are formed by pressing and stamping out a metal plate to a predetermined thickness, and said spiral coils of said earth circuits are made of a print circuit board formed by etching a copper foil in the same planar pattern as said spiral coils of said main circuits.

5. A noise-cut filter as defined in claim 1, wherein said spiral coils of said main circuits are formed by pressing and stamping out a metal plate to a predetermined thickness, and said spiral coils of said main circuits are formed by coating conductive paste material of the same plane pattern as said spiral coils of said main circuits on insulation sheets, said earth circuit functioning as a resonance control resistance.

6. A noise-cut filter as defined in claim 1, wherein conductive paste material is coated on surfaces of said rectangular dielectric chips, which are bonded with said spiral coils in advance, and said dielectric chips and said spiral coils are bonded together through conductive adhesive material.

7. A noise-cut filter as defined in claim 1, wherein conductive paste material is coated on surfaces of said rectangular dielectric chips, which are bonded with said spiral coils in advance, and said dielectric chips and said spiral coils are bonded together through solder material.

8. A noise-cut filter as defined in claim 1, wherein conductive paste material is coated on surfaces of said rectangular dielectric chips, which are bonded with said spiral coils in advance, and said dielectric chips and said spiral coils are bonded together through resin material.

9. A noise-cut filter unit wherein a filter unit is constructed by containing a noise-cut filter as defined in claim 1 in a plastic case, which is sealed with resin material.

10. A noise-cut filter unit as defined in claim 9, wherein said resin material is made of high polymer resin material that is filled by an inorganic filler by a predetermined percentage.

11. A noise-cut filter unit wherein a filter unit is constructed by containing a noise-cut filter as defined in claim 1 in a plastic case; sealing other area in said plastic case by said silicon gel; and sealing only an area at a side, where input/output terminals are arranged, by a high-polymer resin material that is filled by an inorganic filter by a predetermined percentage.

12. A noise-cut filter unit as defined in claim 9, wherein said resin material is comprised of silicon gel, and a cover is provided in an area where input/output terminals are arranged in order to fix the terminals.

13. An electric power converter wherein a noise-cut filter as defined in claim 1 is connected to an input stage and/or an output stage of said electric power converter having switching devices to thereby form common mode choke coils, thus filtering switching noises generated with switching actions of said switching devices.

14. An electric power converter wherein a noise-cut filter as defined in claim 1 is connected to circuits in said electric power converter having switching devices to form common mode choke coils, thus filtering switching noises generated with switching actions of said switching devices.

15. A noise cut filter as defined in claim 1,
wherein each spiral coil is formed within a plane, includes a plurality of turns having a turn length in the plane, and has rectangular cross section with a width which is parallel to the plane; and
wherein each dielectric chip has a length which is less than or equal to the turn length and a width which is less than or equal to the width of the rectangular cross section.

16. A noise cut filter as defined in claim 1, wherein the magnetic body is formed from two halves, each half having an E shape.

* * * * *